United States Patent
Chowdhury et al.

(10) Patent No.: US 7,067,332 B1
(45) Date of Patent: Jun. 27, 2006

(54) METHOD FOR DIE REMOVAL FROM PLASTIC PACKAGES

(75) Inventors: Vijay Chowdhury, Fremont, CA (US); John Aguada, Milpitas, CA (US)

(73) Assignee: Altera Corporation, San Jose, CA (US)

( * ) Notice: Subject to any disclaimer, the term of this patent is extended or adjusted under 35 U.S.C. 154(b) by 287 days.

(21) Appl. No.: 10/803,065

(22) Filed: Mar. 16, 2004
(Under 37 CFR 1.47)

(51) Int. Cl.
*H01L 21/00* (2006.01)
(52) U.S. Cl. .................................................. 438/4
(58) Field of Classification Search ................. 438/4, 438/460
See application file for complete search history.

(56) References Cited

U.S. PATENT DOCUMENTS

| | | | | |
|---|---|---|---|---|
| 5,424,254 A | * | 6/1995 | Damiot | 438/106 |
| 6,223,893 B1 | * | 5/2001 | Kitamura et al. | 206/204 |
| 6,309,899 B1 | * | 10/2001 | Mahanpour et al. | 438/15 |
| 6,335,208 B1 | * | 1/2002 | Lowry | 438/4 |
| 6,429,028 B1 | * | 8/2002 | Young et al. | 438/4 |
| 6,981,585 B1 | * | 1/2006 | Kitamura et al. | 206/204 |

* cited by examiner

*Primary Examiner*—David S. Blum
(74) *Attorney, Agent, or Firm*—Morgan, Lewis & Bockius LLP

(57) ABSTRACT

A method for removing a die from a plastic package. The first step of the method is to remove the package's cap. Next, the package and the die within it are placed on a hot plate and heated up. When the plastic package's temperature reaches a certain limit, the plastic package cracks, resulting in at least one fracture in the package. Each side of the cracked plastic package along the fracture is then grasped by a pair of pliers and the two pairs of pliers are pulled in opposite directions. As a result, the die is detached from the plastic package.

11 Claims, 3 Drawing Sheets

METHOD FOR DIE REMOVAL FROM PLASTIC PACKAGES

FIELD OF THE INVENTION

The present invention relates generally to the field of integrated circuit manufacturing and, in particular, to a novel method for removing a die from a plastic package.

BACKGROUND OF THE INVENTION

Semiconductor device manufacturing principally involves two complex processes, die fabrication and device packaging. Problems associated with any of the two processes may cause the integrated circuit (IC) on the die to malfunction. Failure analysis is an important step in IC production for the purpose of identifying defects in a fabricated die, deducing causes for such defects and coming up with corresponding solutions. As a precondition of failure analysis, a die needs to be removed intact from the package that encases the die before taking any further analytical steps, e.g., parallel lapping and cross-sectioning.

Conventionally, a die is removed from its plastic package through a chemical approach. For example, a die and its plastic package may be submerged in a solvent comprising 50% nitric acid and 50% water. The package material, e.g., a phenol-based compound, reacts with the nitric acid and is then completely dissolved in the solvent. However, since those materials that constitute the die do not react with the solvent, the die itself remains intact. The die is then removed from the solvent and rinsed several times with water to clear away any residual solvent and/or package material from its surface.

There are several issues with this conventional approach. First, the nitric acid solvent is hazardous and an operator needs to be extremely careful and wear protective clothing and gloves during the die removal operation. Second, this approach is time consuming. It takes at least an hour for the package to be completely dissolved and the die to be rinsed and dried.

In view of the aforementioned problems, it would be desirable to develop a die removal method that is both safer and more efficient.

SUMMARY

The present invention is directed to a novel method for removing a die from a plastic package. Unlike the conventional approach, this method does not involve any chemical reaction and it is purely a mechanical procedure, which is safer and more efficient.

The first step of the invention is to remove the cap of a plastic package and expose the die embedded inside the package. The second step is to place the remaining package on a hot plate and then increase the temperature of the hot plate. When the temperature of the plastic package reaches about 460° C., the package cracks, resulting in at least one fracture in the package. Such high temperature also melts down the solder connections connecting the die and the package as well as the epoxy between the die and package. The last step is to grasp the cracked plastic package on either side of the fracture and tear it apart. As a result, the die will be released from the remaining package.

The invention does not involve any chemical reaction as discussed above in connection with the conventional approach. It is both safe and efficient. The whole process takes less than 15 minutes. Further, the die released from the plastic package according to the invention can be used directly in failure analysis without any further cleaning procedures required by the conventional approach.

BRIEF DESCRIPTION OF THE DRAWINGS

The aforementioned features and advantages of the invention as well as additional features and advantages thereof will be more clearly understood hereinafter as a result of a detailed description of preferred embodiments of the invention when taken in conjunction with the drawings wherein.

Like reference numerals refer to corresponding parts throughout the several views of the drawings.

DESCRIPTION OF EMBODIMENTS

The present invention relates to a die removal method that is safer and more efficient than the conventional chemical reaction approach. The die released from a plastic package according to the invention can be used directly in failure analysis.

Figure 1:
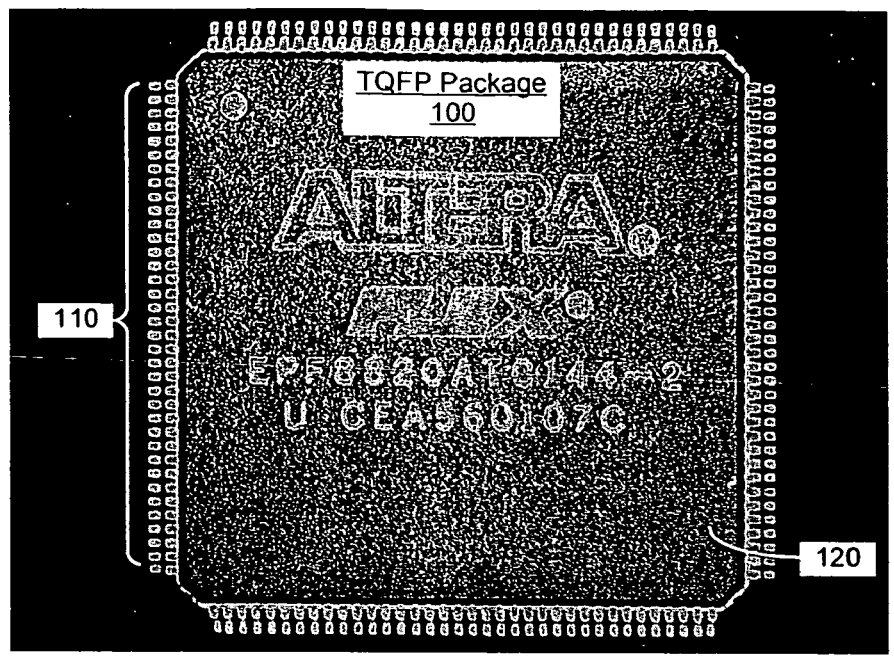
FIG. 1 is a plan view of a thin quad flat pack (TQFP) package.

FIG. 1 is a plan view of an illustrative thin quad flat pack (TQFP) package 100. The TQFP package 100 includes a plurality of pin leads 110 deployed on its four edges and a cap 120 on its top to cover a die embedded in the package (not shown).

Figure 2:
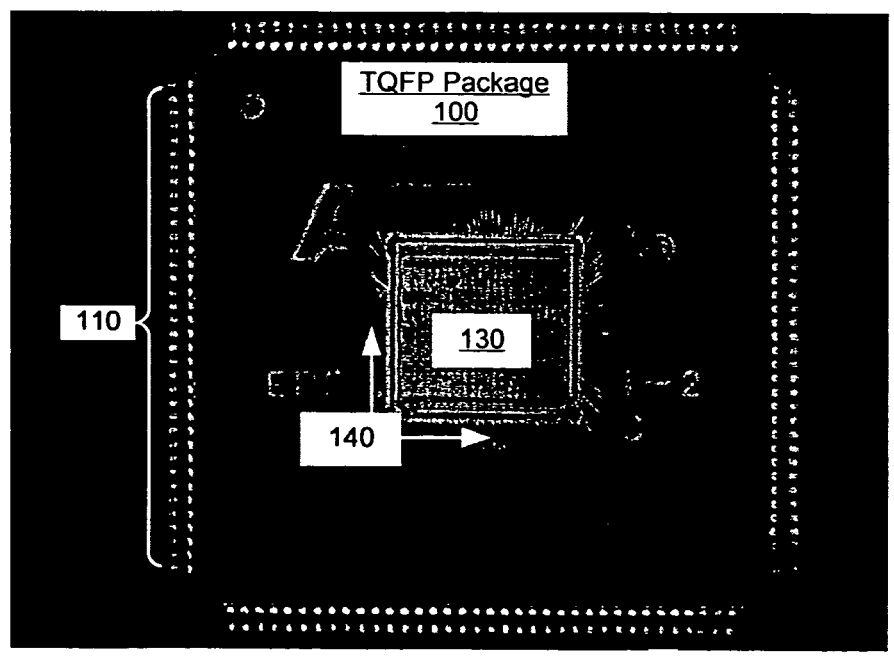
FIG. 2 is a plan view of a de-capped TQFP package.

FIG. 2 is another plan view of the TQFP package 100 after its cap is removed. At the center of the de-capped package 100 is a die 130. The texture on the surface of die 130 suggests that an integrated circuit is fabricated thereon. Surrounding the die 130 are a plurality of bond wires 140 that serve as part of the signal paths between the circuit on this die and the pin leads 10. One end of each bond wire is soldered to a bond pad on the die surface and the other end of the bond wire is soldered to a bond pad on the package 100. The melting temperature of the soldering material is about 240° C. To reduce stress concentration at any solder joint between the die 130 and the package 100 and avoid possible electrical short circuits between adjacent bond wires, an encapsulant (not visible in FIG. 2), e.g., epoxy, is introduced into the package to fill the space between the die and the package and the space between adjacent bond wires. The melting temperature of the epoxy is approximately 150° C.

Figure 3:
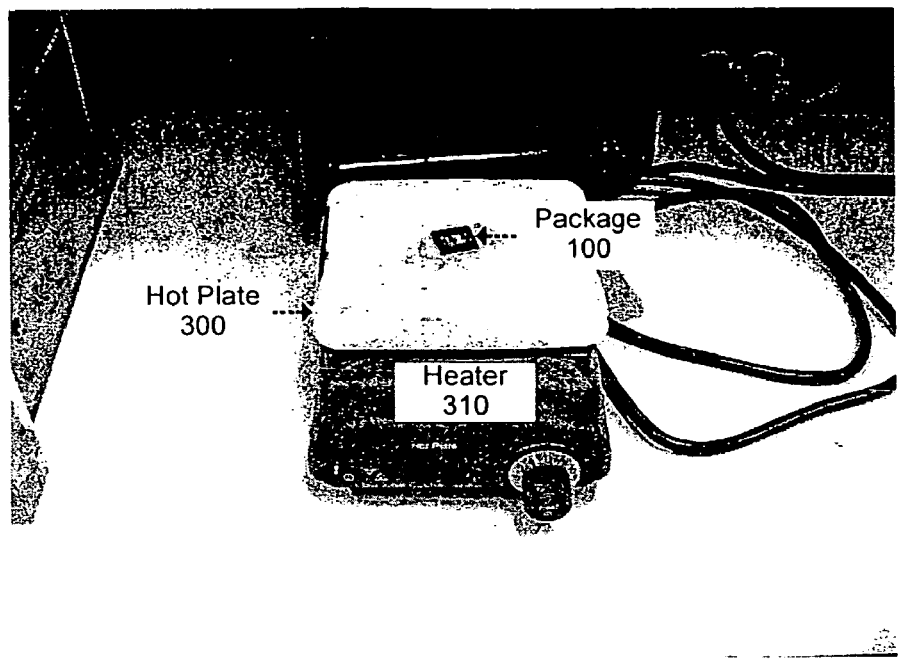
FIG. 3 illustrates the step of heating the de-capped package using a hot plate until it cracks.

After removing its cap, the package 100 is placed on top of a hot plate 300 as shown in FIG. 3. The temperature of the hot plate is controlled by an electrical heater 310. In one embodiment, the heater is turned on and set to produce a temperature of 460° C. As a result, the temperature of the package on the hot plate increases and the package 100 also expands accordingly. Such expansion may cause thermal stress concentration at certain parts of the package due to non-uniformity of the heating process. When the thermal stress reaches a certain limit that is mainly dependent upon the elastic modulus of the package material, the plastic package cracks and produces one or more fractures in the package. Meanwhile, the solder joints and the epoxy between the die and the package can not sustain such high temperature either. They slowly melt down as the package's temperature increases. Therefore, the die is no longer firmly attached to the package. However, the die itself remains intact during the heating process because the materials that constitute the die and the circuit can endure a temperature as high as 800° C.

Figure 4:
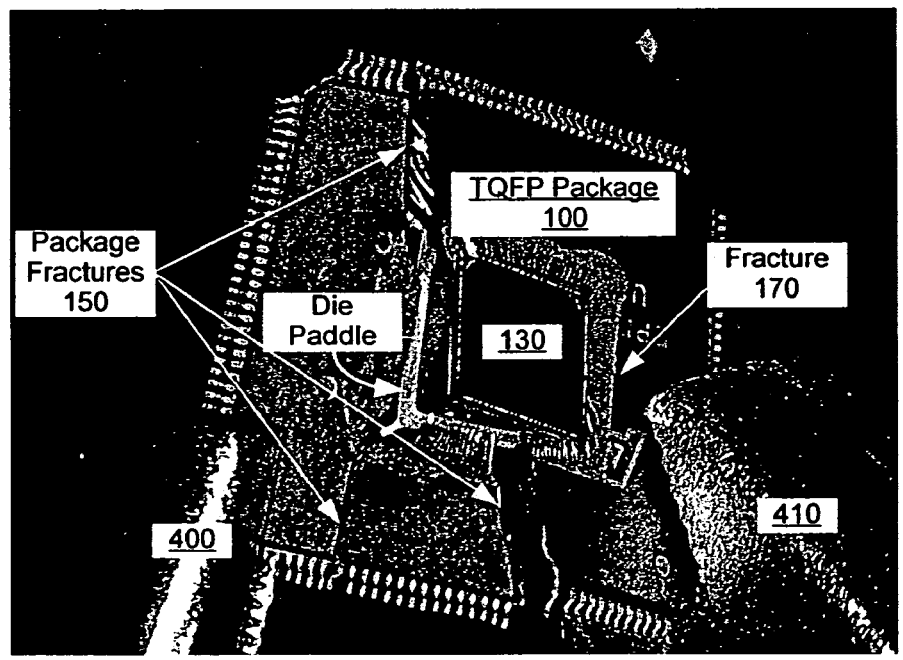
FIG. 4 illustrates the step of grasping the cracked package with two pairs of flat-face pliers to break the cracked package into multiple pieces.

After the package cracks, it is removed from the hot plate. Before the temperature drops significantly, a fracture 150 that preferably splits the package into two halves is quickly identified. As shown in FIG. 4, two pairs of pliers 400 and 410, one pair on each side of the fracture 150, are used to grasp the package and pull it apart. In some cases, such as that shown in FIG. 4, there may be additional fractures such as fractures 170 on the right side of the die. In such cases, the two pairs of pliers are also used to grasp the two sides of the package along the fracture 170 to further detach the die 130 from the cracked package 100. The areas on the package that are grasped by the two pairs of pliers should be about 1 mm away from the edges of the die to avoid having the pliers damage the die when the die is released from the cracked package.

Figure 5:
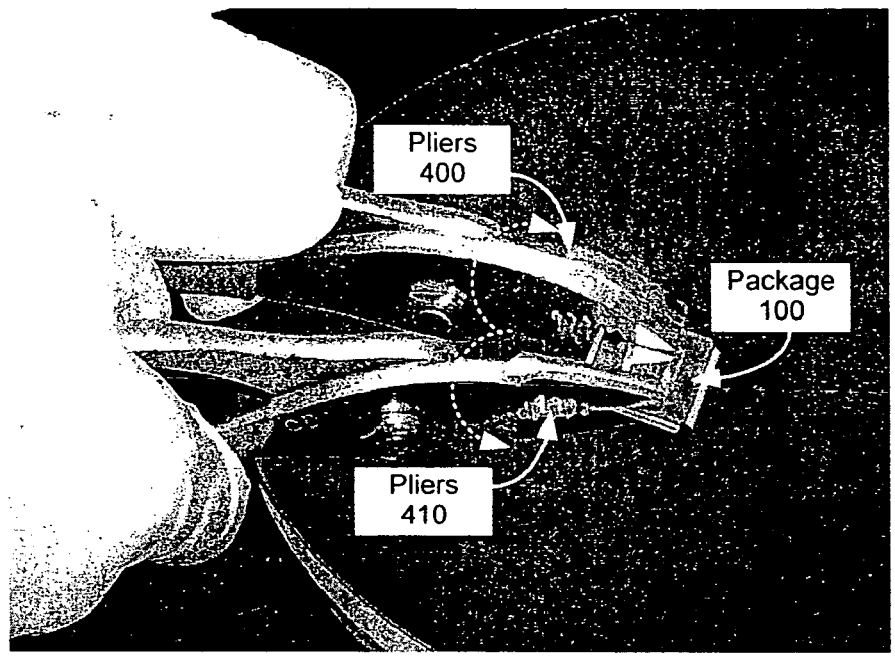
FIG. 5 illustrates the step of twisting the two pairs of pliers in opposite directions to break the cracked package.

There are different techniques for pulling apart the cracked plastic package. In one embodiment (see FIG. 5), one pair of pliers 400 is twisted in a clockwise direction and the other pair of pliers 410 in a counter-clockwise direction. In another embodiment, the two pairs of pliers are pulled away from each other in two opposing directions in the same plane. In yet another embodiment, the two pairs of pliers are pulled away from each other in the two opposing directions in different planes that are parallel to each other. The choice of die removal technique, to a certain degree, depends upon the shape and orientation of the fractures in the plastic package.

Figure 6:
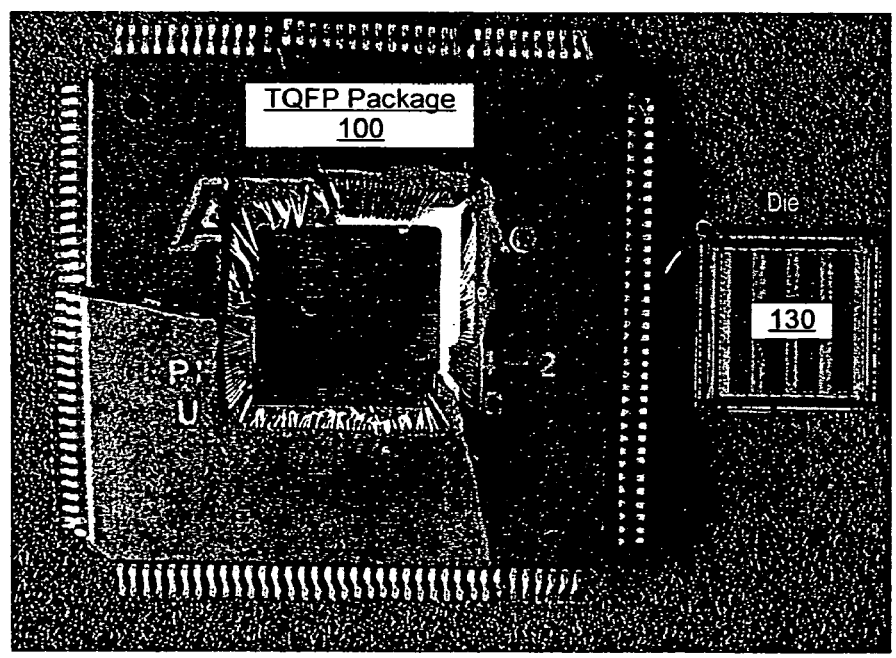
FIG. 6 shows the broken package and a die released from the package.

Finally, FIG. 6 shows the broken package 100 and the die 130 released from the package. This whole process takes less than 15 minutes, compared with the conventional approach that takes at least a hour. Further, this package has avoided the chemical reaction of the conventional approach and therefore there is no need for die cleaning. The die 130 can be used failure analysis without further processing.

The foregoing description, for purpose of explanation, has been set forth with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A method for removing a die from a plastic package, comprising:
   removing a package cap from a top surface of the plastic package;
   heating the plastic package enough such that the plastic package cracks, the cracking resulting in at least one fracture in the plastic package; and
   grasping the plastic package on either side of the fracture and opening the package to detach the die from the cracked plastic package.

2. The method of claim 1, wherein the plastic package is held by two pairs of pliers, one pair of pliers on either side of the fracture.

3. The method of claim 2, wherein the two pairs of pliers are pulled in two opposite directions that are in substantially a same plane.

4. The method of claim 2, wherein the two pairs of pliers are pulled in two opposite directions in two planes that are parallel to each other.

5. The method of claim 2, wherein one of the two pairs of pliers is twisted in a clockwise direction and the other of the two pairs of pliers is twisted in a counter-clockwise direction.

6. The method of claim 2, wherein each pair of pliers grasps one area of the plastic package on one side of the fracture and the two areas that are grasped by the two pairs of pliers are substantially away from the die.

7. The method of claim 6, wherein each of the two pairs of pliers has a pair of flat surfaces and each pair of pliers grasps one of the two areas using its pair of flat surfaces.

8. The method of claim 1, wherein the die is attached to the plastic package through an array of solder connections and epoxy material.

9. The method of claim 8, wherein the plastic package is heated sufficiently high to melt down the solder connections and the epoxy material without damaging the die.

10. The method of claim 1, wherein the step of heating the plastic package comprises placing the plastic package on a hot plate.

11. The method of claim 10, wherein the temperature of the hot plate is about 460° C.

* * * * *